(12) United States Patent
Beckous

(10) Patent No.: US 6,498,506 B1
(45) Date of Patent: Dec. 24, 2002

(54) SPRING PROBE ASSEMBLIES

(75) Inventor: Frank R. Beckous, Newark, DE (US)

(73) Assignee: Gore Enterprise Holdings, Inc., Newark, DE (US)

(*) Notice: Subject to any disclaimer, the term of this patent is extended or adjusted under 35 U.S.C. 154(b) by 0 days.

(21) Appl. No.: 09/643,664

(22) Filed: Jul. 26, 2000

(51) Int. Cl.$^7$ .............................................. G01R 31/02
(52) U.S. Cl. ........................ 324/761; 324/538; 324/784
(58) Field of Search ................................ 324/754, 755, 324/758, 761, 538; 439/578, 608, 700, 92, 98, 99, 497, 579, 581, 610, 638; 174/88 R, 78, 75 C; 333/246, 260

(56) References Cited

U.S. PATENT DOCUMENTS

| | | | |
|---|---|---|---|
| 4,724,180 A | 2/1988 | Kern ........................... 428/131 |
| 4,931,726 A | 6/1990 | Kasukabe et al. .......... 324/158 |
| 5,190,472 A | 3/1993 | Voltz et al. ................. 439/579 |
| 5,194,020 A | 3/1993 | Voltz ........................... 439/579 |
| 5,218,293 A | 6/1993 | Kan ............................ 324/158 |
| 5,437,562 A | 8/1995 | Michael ....................... 439/581 |
| 5,509,827 A | * 4/1996 | Huppenthal ................. 174/74 R |
| 5,527,189 A | * 6/1996 | Middlehurst ................ 439/608 |
| 5,567,179 A | * 10/1996 | Voltz ........................... 439/578 |
| 5,576,631 A | 11/1996 | Stowers et al. ............. 324/761 |
| 5,604,440 A | * 2/1997 | Tomikawa .................... 324/538 |
| 5,654,647 A | 8/1997 | Uhling et al. ................ 324/754 |
| 5,711,676 A | 1/1998 | Michael, III ................. 439/63 |
| 5,850,147 A | 12/1998 | Stowers et al. ............. 324/761 |
| 5,865,641 A | 2/1999 | Swart et al. ................. 439/482 |
| 5,997,314 A | 12/1999 | Wallace et al. .............. 439/63 |
| 6,307,787 B1 | 3/2000 | Corwith ....................... 324/754 |

\* cited by examiner

Primary Examiner—Michael Sherry
Assistant Examiner—Trung Nguyen
(74) Attorney, Agent, or Firm—Alan M. Wheatcraft

(57) ABSTRACT

A spring probe assembly 10 which contains spring probes 50 and 60 used for mating to various planar devices, such as a printed circuit board, via spring contact with interface areas on their surfaces. The assembly 10 is comprised of a non-metallic, insulating material block 20 which has been crafted to secure multiple, impedance matched, coaxial spring probe assemblies 50 and ground spring pins 60. A metallic clip 70 is used to join the signal probe shield 54 with the ground spring pin 62 in the appropriate geometry, while isolating that signal probe shield 54 and ground spring pin 62 from all other signal probe shields 54 and ground pins 62. The pins 52 of the signal probes 50 make contact with the surfaces of various planar devices via back pressure applied to the pins 52.

6 Claims, 2 Drawing Sheets

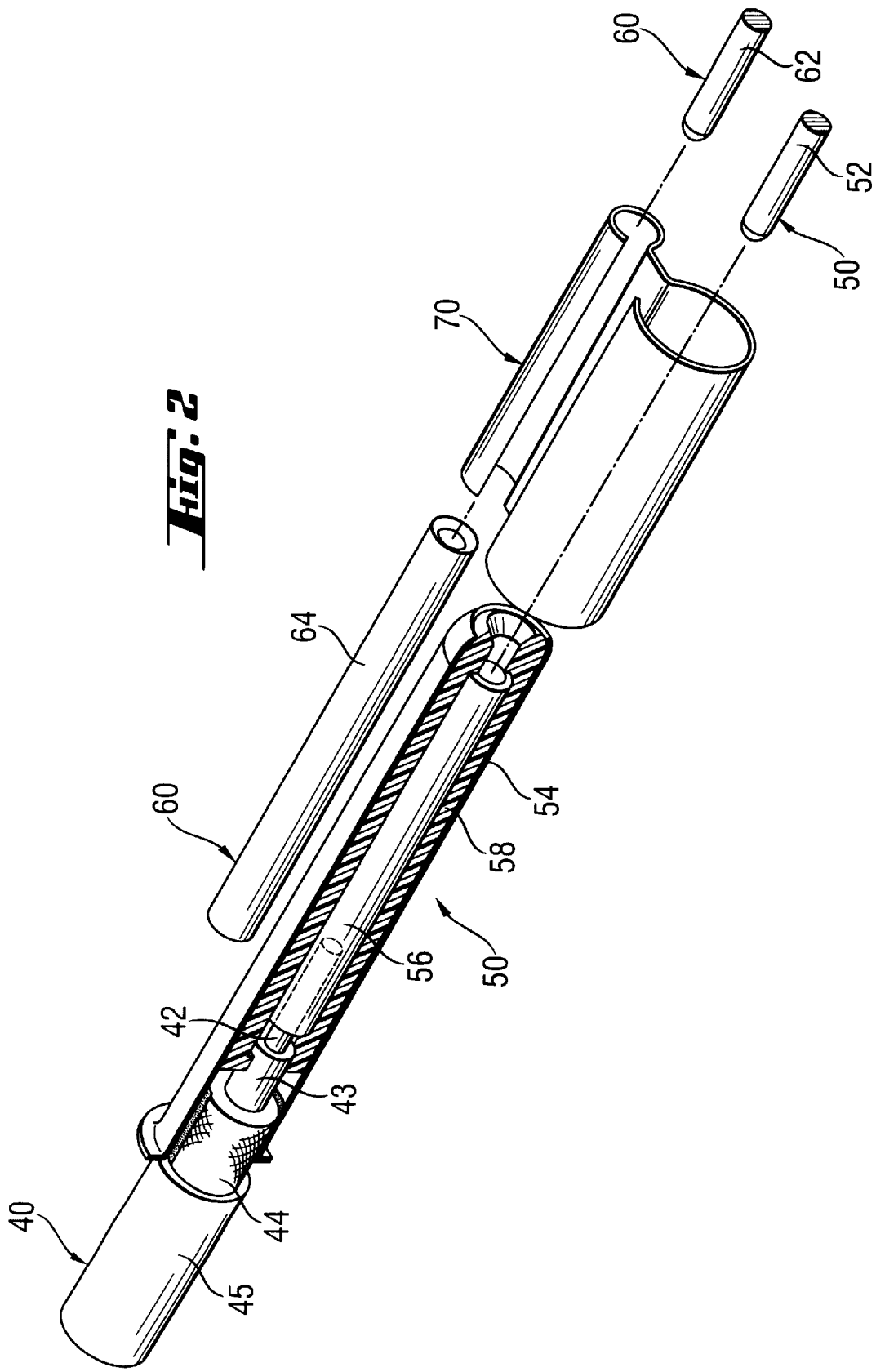

SPRING PROBE ASSEMBLIES

FIELD OF THE INVENTION

The invention relates to spring probe assemblies.

BACKGROUND OF THE INVENTION

This invention relates to spring probe assemblies which will mate to some type of planar device, like a printed circuit board (PCB). The spring probe assemblies use spring-loaded pins, of appropriate spring force, to transfer the signal from a signal source to the circuitry of the planar device. This process is normally accomplished using spring probes assemblies, which have well matched impedances, whose ground shields are linked together in a metal block. Ground spring probes located in various locations in the metal block then form the signal return path.

It is known that some planar devices require the interface of signals of various frequencies. In such cases the use of common grounds, as the signal return path for those various frequencies, will result in what is called common mode problems which degrade the quality of the signals being sent to and from the planar device.

SUMMARY OF THE INVENTION

It is therefore an object of the invention to improve the quality of the signals transmitted through a spring probe assembly.

It is furthermore an object of the invention to eliminate common mode problems in spring probe assemblies in which signals of differing frequencies are present.

It is furthermore an object of the invention to facilitate repair of spring probe assemblies.

These and other objects of the invention are achieved by providing a spring probe assembly with an insulating housing having a plurality of openings in a front face of the insulating housing. Each of the openings has a first part and a second part which are connected together by a channel in the insulating housing. One or more first probes are disposed in the first parts of the openings and one or more second probes disposed in the second parts of the openings. Clips are disposed in the channels and these connect electrically the one or more first probes to the one or more second probes.

The use of an insulating housing with two different probes allows one of the probes to carry signals and the other one of the probes to be connected separately to ground. Each of the two different probes can be isolated from one another, and thus signal integrity is improved. It is possible to connect two or more of one type of the probes to a single one of the other type of probes. Furthermore, each of the probes can be separately replaced, which improves the reparability of the assembly. The relationship of the pairs of the probes is chosen such that there is minimum interference due to common mode and maximum transference of the intended high speed signal with a minimum of signal degradation.

A further advantage of the invention is that two or more different ones of the first probes can each carry signals of different frequencies. Each of the two or more different ones of the first probes are isolated from each other, and there is therefore little or no interaction between each of the probes, and cross-talk between signals is minimized.

In one embodiment of the invention, the first parts of the plurality of openings extend through the insulating housing from the front face to a back face and thus allows easy connection of the probe in the first parts of the openings to be connected to a coaxial cable.

The first probes are constructed such that they have a central probe conductor placed within an outer probe receptacle and an outer probe shield disposed about the first outer probe receptacle. The outer probe shield is electrically insulated from the central probe conductor. In this construction, the first probes can carry a signal which is shielded from interference by the outer probe shield. The outer probe shield is connected to the shield of the coaxial cable, and the central probe conductor is connected to the central cable conductor of the coaxial cable.

The second probes have a second central probe conductor and a second outer probe receptacle disposed in second parts of the plurality of the openings. The clips connect the first probe shield of the first probes with the second outer probe receptacle. In this configuration, the second probes carry the grounds. The first probe shields are isolated from each other, thus improving signal integrity over prior art constructions. One or more of the second probes are connected to a single first probe shield by means of one or more clips.

BRIEF DESCRIPTION OF THE DRAWINGS

FIG. 2 is a perspective view of the coaxial cable with the coaxial spring probe assembly attached.

DETAILED DESCRIPTION OF THE INVENTION

Figure 1:
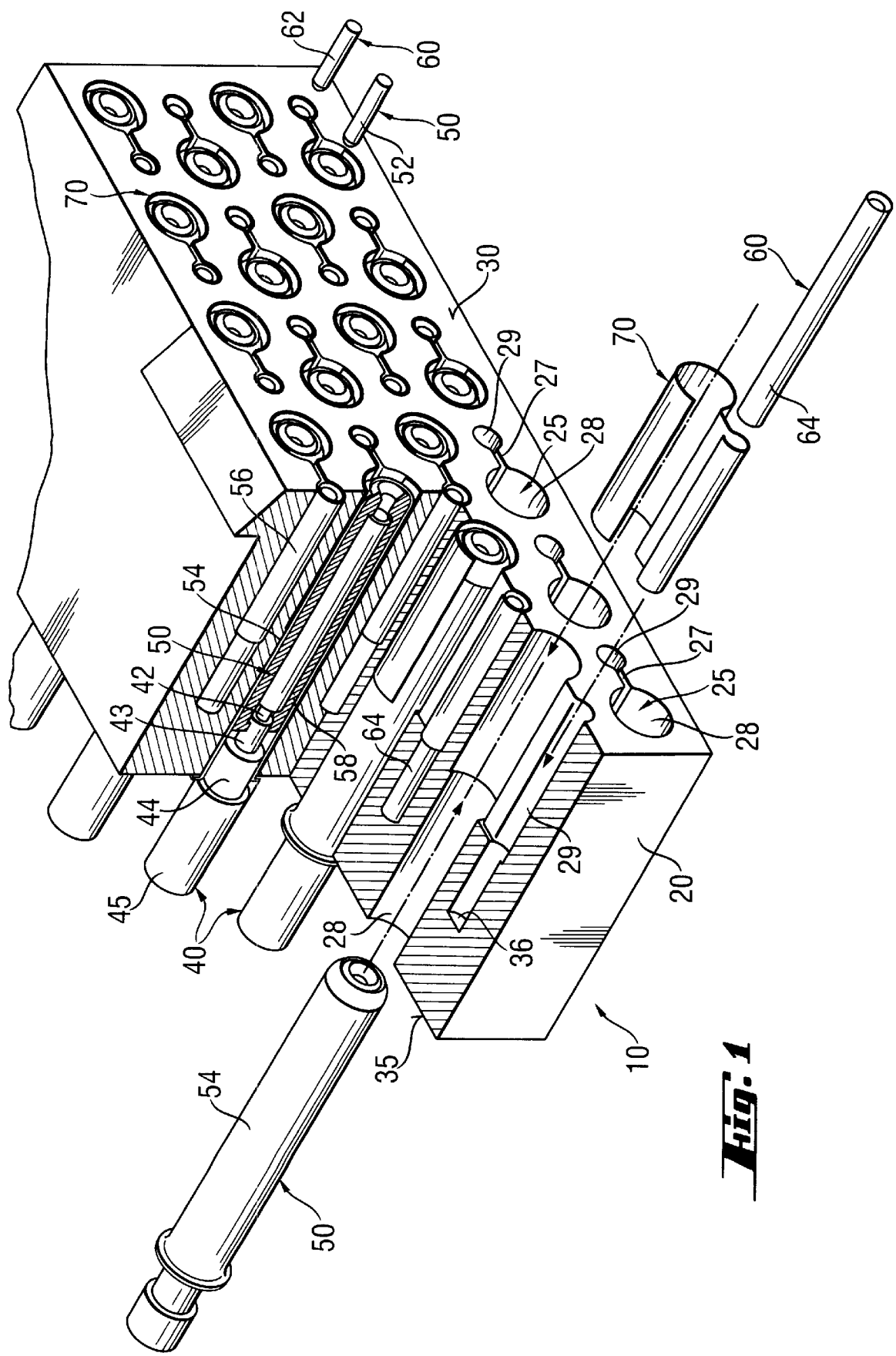
FIG. 1 is a cut view of the spring probe assemblies including ground probes and ground clips in an insulating housing.

FIG. 1 shows an example of a spring probe assembly 10 according to the invention. The spring probe assembly 10 comprises a non-metallic insulating housing 20 which is made of a material such as a thermoplastic including ULTEM® and Liquid Crystal Polymers (LCP). A plurality of openings 25 are disposed within a front face 30 of the spring probe assembly 10. Each of the openings 25 comprises a first part 28 and a second part 29 connected by a channel 27. Both the first part 28 and the second part 29 of the plurality of openings 25 are substantially cylindrical in shape. In this particular embodiment of the invention, the diameter of the first part 28 is greater than the diameter of the second part 29. These diameters are, however, not limiting of the invention. The first parts 28 of the plurality of the openings 25 extend through the insulating housing 20 from the front face 30 to a back face 35. The second parts 29 of the plurality of the openings 25 extend from the front face 30 to a depth 36 within the insulating housing 20. The channels 27 connect the bores of the first parts 28 to the bores of the second parts 29 over a substantial depth within the insulating housing 20.

A signal probe 50 is inserted into the first parts 28 of the plurality of the openings 25. As is shown in FIG. 2, the signal probe 50 comprises a central probe conductor 52 disposed within a signal probe receptacle 56 and isolated from it by an insulating material 58. A probe shield 54 is disposed about the signal probe receptacle 56. Construction of such signal probes 50 is known in the art, and any suitable signal probes can be used. The signal probe 50 is connected to a coaxial cable 40 in which a central cable conductor 42 of the coaxial cable 40 is connected to the signal probe receptacle 56, and the coaxial shield 44 of the coaxial cable 40 is connected to the probe shield 54 as is known in the art. The coaxial cable 40 has furthermore a jacket 45 disposed about the coaxial shield 44 and an insulating layer 43 between the central cable conductor 42 and the coaxial shield 44. The signal probes 50 can carry signals of different or of the same frequency.

A ground probe 60 is inserted into the second parts 29 of the plurality of the openings 25. The ground probe 60 comprises a spring ground probe 62 disposed within a ground receptacle 64. Construction of such ground probes 60 is known in the art, and any suitable ground probes can be used.

A grounding clip 70 is connected between the outer surface of the probe shield 54 of the signal probe 50 and the outer surface of the ground receptacle 64 of the ground probe 60. The grounding clip 70 is of a dimension that fits into the recesses 27. The grounding clip 70 is made of a conducting material such as phosphor bronze, copper or beryllium-copper alloy.

The integrity of the high performance signals transported along the path from the coaxial cable 40 to the signal probe 50 is maintained by the tight impedance matches achieved throughout the coaxial cable 40 and the signal probe 50. This relationship is further controlled to the planar device via the association established between the ground probe 60 and the signal probe 50 by the grounding clip 70.

One advantage of the design of the spring probe assembly 10 according to this invention is that if a component is damaged, then the individual ground spring receptacles, grounding clips 70, signal probes 50, ground probes 60 and even the insulating housing 20 are all replaceable items. The individual central probe conductors 52 and spring ground probes 62 are field replaceable items.

In this embodiment of the invention, each of the openings 25 has two parts containing two different probes. It is conceivable to have openings 25 with more than two parts in which, for example, two or more ground probes 60 are connected to the probe shield 54 of one signal probe 50. This is achieved by having two grounding clips present in two channels 27. The best signal isolation is achieved if the two ground probes 60 are placed diametrically opposite each other about the signal probe 50.

While the invention has been disclosed in preferred embodiments, various modifications may be made therein by those skilled in the art without departing from the spirit and scope of the invention, as defined in the appended claims.

What is claimed is:

1. Connector comprising:
   an insulating housing having a plurality of openings in a front face of the insulating housing, each of said plurality of openings having a first part and second part connected by a channel;
   one or more first probes disposed in first parts of the plurality of the openings;
   one or more second probes disposed in second parts of the plurality of the openings; and one or more clips disposed in said channels and electrically connecting said one or more first probes to said one or more second probes, and wherein said one or more first probes are isolated from each other by said one or more clips;
   wherein a first one of said one or more first probes is connectable to a signal of a first frequency and a second one of said one or more first probes is connectable to a signal of a second frequency, the first frequency being different than the second frequency;
   wherein at least one of said one or more clips electrically connects one of said one or more first probes to two of said one or more second probes.

2. Connector according to claim 1 wherein the first part of said plurality of openings extends through the insulating housing from the front face to a back face.

3. Connector according to claim 1 wherein the one or more first probes have a first central probe conductor within a first outer probe receptacle, and a first outer probe shield disposed about the first outer probe receptacle which is isolated from the first outer probe shield by a first probe insulator.

4. Connector according to claim 3 wherein the one or more second probes have a second central probe conductor and a second outer probe receptacle disposed in second parts of the plurality of the openings; and
   said one or more clips connects the first probe shield of the one or more first probes with the second outer probe receptacle.

5. Connector according to claim 3 wherein at least one coaxial cable having a central cable conductor and a cable shield is attached to one of the one or more first probes, the central cable conductor being electrically connected to the first outer probe receptacle and the cable shield being electrically connected to the first outer probe shield.

6. Connector according to claim 1 wherein at least one cable having a first conducting element and a second conducting element is electrically connected to said one or more first probes and said one or more second probes through a back face of the insulating housing.

* * * * *